United States Patent [19]
Takegami et al.

[11] Patent Number: 5,381,345
[45] Date of Patent: Jan. 10, 1995

[54] LOGIC-CIRCUIT LAYOUT PATTERN INSPECTION METHOD AND LOGICAL SIMULATION

[75] Inventors: Hiroshi Takegami; Makoto Morikawa; Hirokazu Fujiki, all of Kyoto, Japan

[73] Assignee: Rohm Co., Ltd., Kyoto, Japan

[21] Appl. No.: 935,994

[22] Filed: Aug. 27, 1992

[30] Foreign Application Priority Data
Sep. 2, 1991 [JP] Japan .................................. 3-221651

[51] Int. Cl.⁶ ............................................. G06F 15/60
[52] U.S. Cl. ..................................... 364/491; 364/489; 364/578
[58] Field of Search ................ 364/488, 489, 490, 491, 364/578

[56] References Cited
U.S. PATENT DOCUMENTS

| | | | |
|---|---|---|---|
| 4,823,278 | 4/1989 | Kikuchi et al. | 364/491 |
| 5,031,111 | 7/1991 | Chao et al. | 364/491 |
| 5,046,017 | 9/1991 | Yuyama et al. | 364/491 |
| 5,197,015 | 3/1993 | Hartoog et al. | 364/490 |

Primary Examiner—Kevin J. Teska
Assistant Examiner—Susan Wieland
Attorney, Agent, or Firm—Dickstein, Shapiro & Morin

[57] ABSTRACT

A circuit layout pattern inspection method and a logical simulator for implementing the same. Wiring is substituted by a $\pi$ or T equivalent circuit and is described by a nodal equation, and a gate is described by a simplified model, that is, a current source calculation formula. By the nodal equation and the current source calculation formula, a simulation is performed to obtain a delay time for every node. The obtained delay time is stored to make the inspection easy.

15 Claims, 6 Drawing Sheets

LOGIC-CIRCUIT LAYOUT PATTERN INSPECTION METHOD AND LOGICAL SIMULATION

BACKGROUND OF THE INVENTION i) Field of the Invention

The present invention relates to an inspection method for a layout pattern of a logic circuit device or the like and a logical simulator for implementing the same.

ii) Description of the Related Arts

Generally, when designing the layout of a logic integrated circuit device, an unpredictable or unexpected electrostatic capacitance, that is, a parasitic capacitance is often caused. Because of the influence of this parasitic capacitance, the delay of a gate is increased to sometimes cause a malfunction in a completed product. In order to prevent the occurrence of this malfunction, conventionally, the wiring having a particularly large delay time influence on a circuit is marked and listed in advance. When the layout of the logic integrated circuit is manually designed, in particular, it is considered that the listed wiring is connected so as to be as short as possible in order to reduce the parasitic capacitance. In the automatic layout designing of the logic integrated circuit, a limitation is given to the wiring length by using various parameters.

However, since load capacitance differs depending on the types of output gate connected to the wiring, in theory, it is necessary to change the limiting extent of the wiring length for each type of output gate, but this is hardly practical. Further, control of the relative delay time is a very difficult task.

On the other hand, software for extracting the parasitic capacitance of the wiring after finishing the layout design of the logic integrated circuit is already available. Thus, it is possible to calculate the parasitic capacitance of the wiring by using this software, but there are no means for making efficient use of this calculated parasitic capacitance value. As a result, much effort is required for the feedback of the parasitic capacitance to the layout design stage.

Hence, the present inventor has proposed an inspection method for a layout pattern of a logic integrated circuit device or the like, which is capable of not only setting various limitations on the layout design but also predicting any malfunction of the completed product due to the delay time after finishing the layout design. In this method, a plurality of model values of load capacitance are given to a reference gate by a circuit simulator to calculate corresponding delay times. Then, a function of the load capacitance vs. the delay time is generated from the given model values of the load capacitance and the calculated delay times, and the parasitic capacitance of the layout pattern to be inspected is extracted at the same time. Next, the function of the load capacitance vs. the delay time is made by reference to the wiring of each drive gate and the obtained parasitic capacitance to calculate The delay time at the reference gate. Then, a correction is added to the calculated delay time by considering a wiring logic W/L of the drive gate, and the corrected delay time is transformed to data adaptable to an input format to a logical simulator (analog simulator) for operating the logical simulator. As a result, the comparison between the expected output value of the layout in which the influence of the parasitic capacitance has been corrected and the expected output value of layout at the initial design stage is made possible.

In the above-described conventional layout pattern inspection method, the design margin including the circuit design and the layout design of the products can be exactly predicted. Further, since the design evaluation of the layout pattern can be exactly performed, if there is a problem, the feedback of the result is immediate so no actual product is produced. As a result, the period from the initial design stage to product shipping can be greatly reduced compared with the former method.

Figure 8:
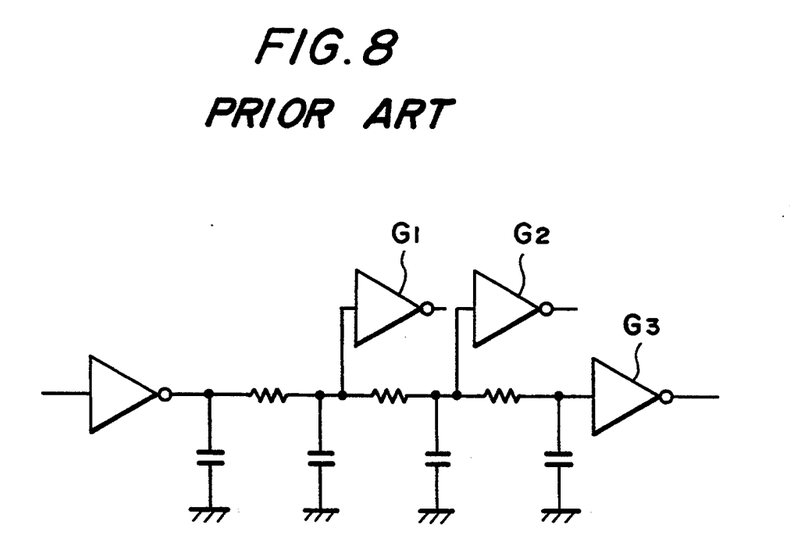
FIG. 8 is a circuit diagram of a circuit used for explaining a conventional circuit layout pattern inspection method.

However, in this case, for example, delay times of gates G1, G2 and G3 shown in FIG. 8 are dealt with the same value. Even if the wiring length to input terminals of the gates G1, G2 and G3 is equal, the actual delay times are different because of the influence of their line resistances, and thus this method brings about an inspection error. In addition, when the parameter of the logical simulator is changed, each time, it is necessary to recompute the function of the load capacitance vs. the delay time.

SUMMARY OF THE INVENTION

It is therefore an object of the present invention to provide a circuit layout pattern inspection method in view of the aforementioned problems of the prior art, which is capable of disaffecting a difference of line resistances and coping with the situation when a parameter of a logical simulator is changed.

It is another object of the present invention to provide a logical simulator for implementing a circuit layout pattern inspection method which is capable of disaffecting a difference of line resistances and coping with the situation when a parameter of a logical simulator is changed.

In accordance with one aspect of the present invention, there is provided a circuit layout pattern inspection method, comprising the steps of:

a) extracting parasitic elements including parasitic resistance on wiring route from a circuit layout pattern to be simulated;

b) generating a first circuit of the wiring from the extracted parasitic elements;

c) generating an equivalent circuit of a gate for outputting a signal to the wiring on the basis of a parameter describing characteristics of an active element constituting the gate according to a simplified model;

d) performing a simulation of an operation at nodes on basis of the equivalent circuit of the wiring and the equivalent circuit of the gate; and e) obtaining a delay time required for the signal to be transmitted to the wiring from the result of the simulation.

Further, in accordance with another aspect of the present invention, there is provided a logical simulator for implementing the circuit layout pattern inspection method, comprising:

a) means for extracting parasitic elements including a parasitic resistance on a wiring from a circuit layout pattern to be simulated;

b) means for generating an equivalent circuit of the wiring from the extracted parasitic elements;

c) means for generating an equivalent circuit of a gate for outputting a signal to the wiring on the basis of a parameter describing characteristics of an active element constituting the gate according to a simplified model;

d) means for performing a simulation of an operation at nodes on the wiring corresponding to an operation of the gate on the basis of the equivalent circuit of the wiring and the equivalent circuit of the gate; and e) means for obtaining a delay time required for which the signal transmits on the wiring from the result of the simulation.

Therefore, according to the present invention, first, the parasitic elements of the wiring are extracted and the equivalent circuit of the wiring is generated. Next, the equivalent circuit of the gate is generated. Then, the simulation is performed using the two obtained equivalent circuits to obtain the delay time.

At this time, since the extracted parasitic elements includes the parasitic resistance, the inspection error caused by the parasitic resistance can be reduced. For example, this can be applied the aluminum wiring and the polycrystalline silicon wiring to enable a reduction in the inspection error. Further, the presence or absence of a branch or branches and the number of the branches can be reflected to enable a reduction in the inspection error.

Further, according to the present invention, a model of an active element constituting a gate such as an FET or the like can be simplified to be a model including only a current source and an electrostatic capacity. Hence, even when the parameter of the active element is changed, the present method can cope with it readily and flexibly. Further, the simulation itself can be carried out at a high speed.

The wiring equivalent circuit is preferably an equivalent circuit expressed by a concentrated constant circuit. As a result, the simulation can be readily performed, and compared with a method for obtaining an analytical solution, the above-described effects can be realized by simple software or hardware. For example, a $\pi$ or T equivalent circuit can be used. These circuits can be described by a nodal equation.

Further, as to the parasitic elements to be extracted, the parasitic capacitance can be included in addition to the parasitic resistance. As a result, in the calculation, the electrostatic capacitance included in the simplified active element model can be included in the parasitic capacitance. Relating to the active elements, for example, known parameters on the data base such as SPICE parameters or the like can be used.

BRIEF DESCRIPTION OF THE DRAWINGS

These and other objects, features and advantages of the present invention will more fully appear from the following description of the preferred embodiments with reference to the accompanying drawings, in which.

DESCRIPTION OF THE PREFERRED EMBODIMENTS

Figure 1:
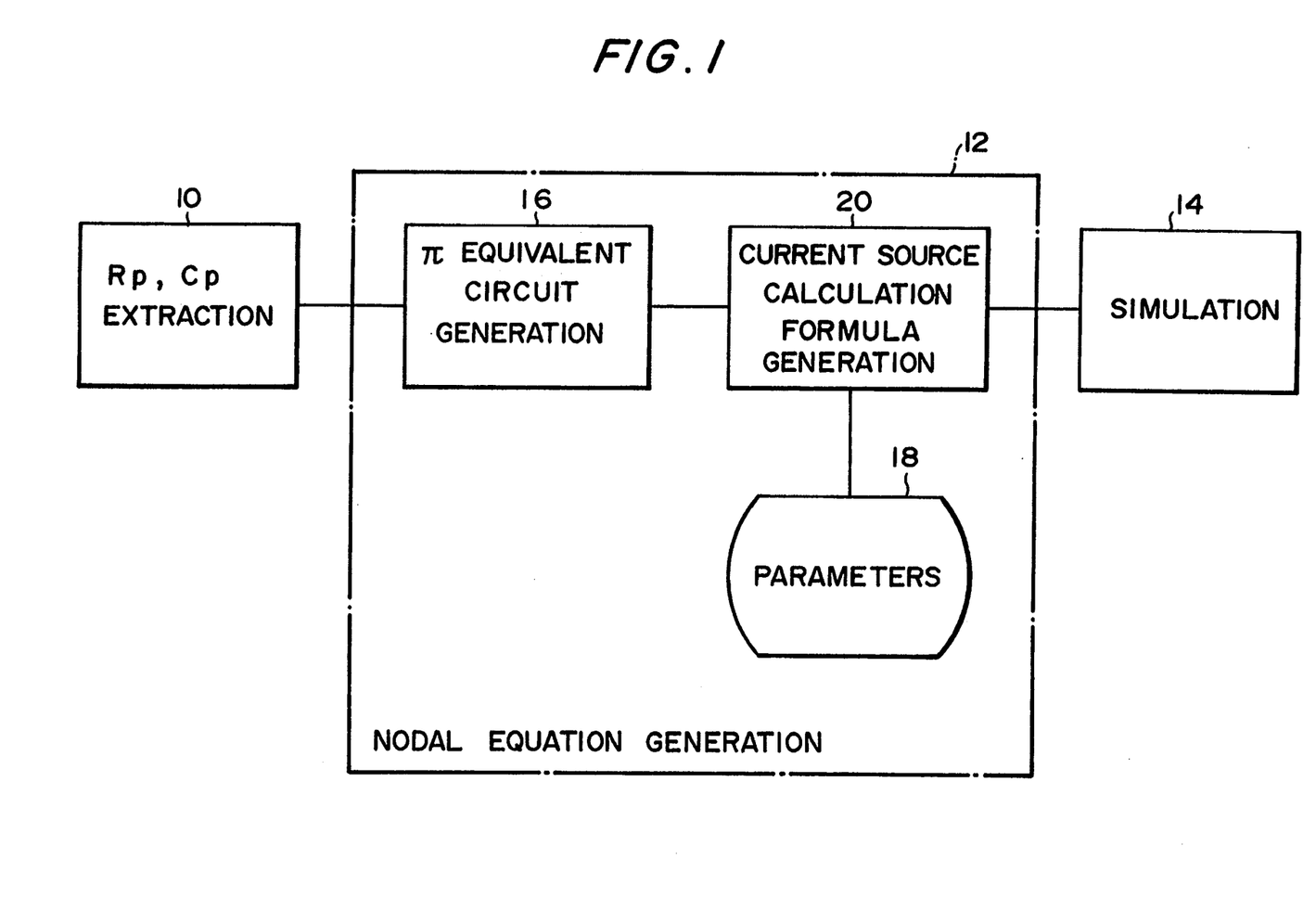
FIG. 1 is a block diagram of a logical simulator for implementing a first embodiment of a circuit layout pattern inspection method according to the present invention.

Referring now to the drawings, wherein like reference characters designate like or corresponding parts throughout the views and thus the repeated description thereof can be omitted for brevity, there is shown in FIG. 1 a logical simulator for implementing the first embodiment of a circuit layout pattern inspection method according to the present invention. This simulator is used for a layout pattern of a circuit shown in FIG. 3 or this simulator simulates an analog operation of a logical circuit and thus is called a timing simulator. In the circuit layout pattern inspection method according to the present invention, no limitation can be added to the structure of the apparatus. The structure shown in FIG. 1 illustrates the necessary functions for implementing the circuit layout pattern inspection method, and thus each block can be implemented by either software or hardware.

As shown in FIG. 1, this simulator comprises an Rp and Cp extraction part 10, a nodal equation generation part 12 and a simulation part 14. In this embodiment, when a layout pattern of a circuit is inspected, a simulation on a time axis is carried out by the simulation part 14. In this simulation, the circuit shown in the form of the layout pattern is dealt with not as a distributed constant circuit but a concentrated constant circuit. Hence, the simulation can be more readily performed compared with the distributed constant circuit case. In this embodiment, for example, a known algorithm of circuit simulator such as SPICE or the like can be applied to the simulation part 14.

The nodal equation generation part 12 generates a nodal equation to be used for the simulation. This results in a circuit to be simulated being expressed by a concentrated constant circuit.

Further, for setting up the equation, it is necessary to know the values of the circuit elements positioned between the nodes or connected to the nodes. For the circuit elements, a parasitic resistance Rp and a parasitic capacitance Cp can be given as the circuit elements relating to the wiring. The parasitic resistance Rp can be shown as a resistance between the nodes, and the parasitic capacitance Cp can be shown as a grounding capacitance at the nodes.

Further, the circuit elements of the parts except the wiring can be approximately represented as a current source and an electrostatic capacitance incidental thereto. As well-known, when an equivalent circuit of a transistor and the like constituting a logic gate is accurately shown, is very complicated. Thus, by making it simple, that dealing with it as the current source and its incidental electrostatic capacitance, the calculation time required to perform the simulation can be reduced.

The Rp and Cp extraction part 10 extracts the parasitic resistance Rp and the parasitic capacitance Cp in the parasitic elements of the wiring contained in the layout pattern to be inspected. The nodal equation generation part 12 includes a π equivalent circuit generation part 16 for generating a π equivalent circuit of the wiring on the basis of the parasitic resistance Rp and the parasitic capacitance Cp, and a data base 18 for storing various parameters for describing characteristics of an active element such as a transistor, the parameters being included in a model of a transistor or the like, for example, a current value of a current source of an NMOSFET, and elemental values such as an electrostatic capacitance between a gate and a source of a transistor, an electrostatic capacitance between a gate and drain, and the like. The nodal equation generation part 12 transforms an active element appearing in the circuit for the layout designing into a simplified model (including only, for example, the current source and a small number of electrostatic capacitances) on the basis of the parameters stored in the data base 18 and deals with the simplified models. In other words, the nodal equation generation part 12 generates a calculation formula of the simplified model (since the calculation formula includes only the current source other than the electrostatic capacitances, the calculation formula will be hereinafter referred to as a current source calculation formula). For generation of the current source calculation formula, the nodal equation generation part 12 also includes a current source calculation formula generation part 20.

Figure 2:
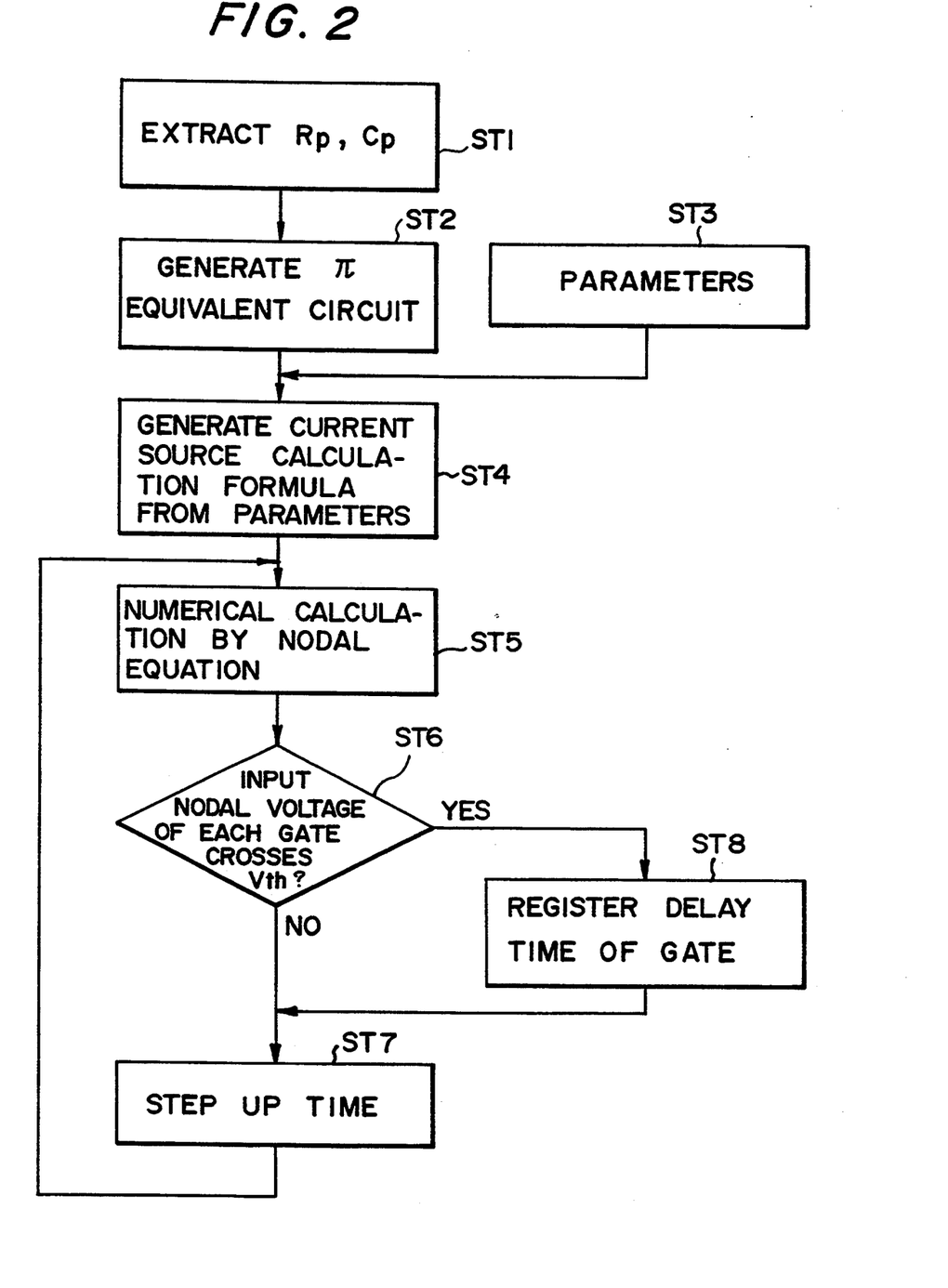
FIG. 2 is a flow chart showing the circuit layout pattern inspection method according to the present invention.

In FIG. 2, there is shown a flow chart of the operation of this embodiment described above.

Figure 3:
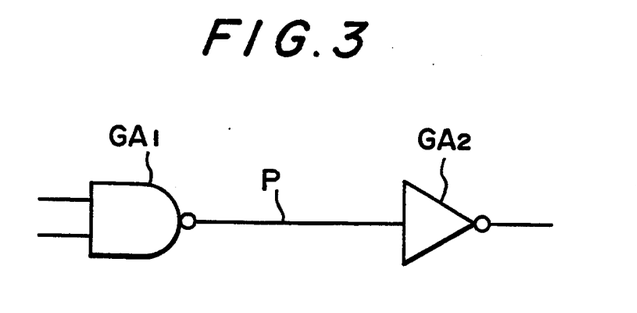
FIG. 3 is a circuit diagram of a circuit whose layout is automatically designed by using the simulator shown in FIG. 1.
Figure 4:
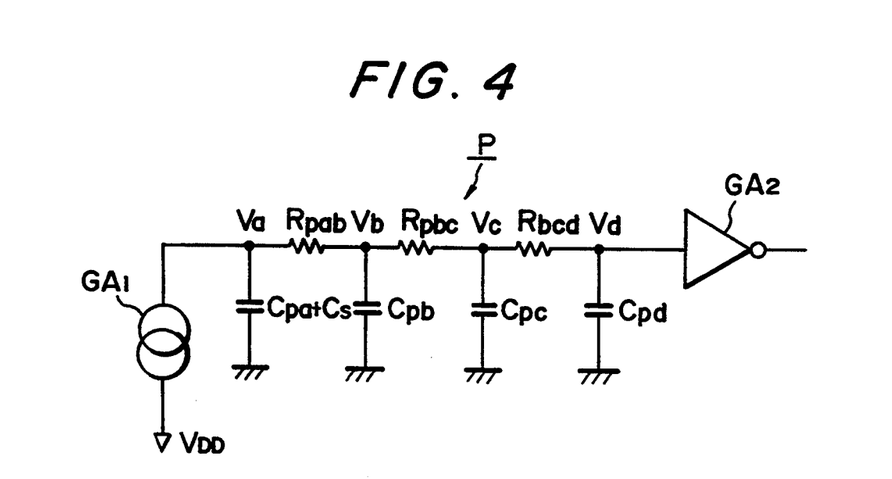
FIGS. 4 and 5 are circuit diagrams of a $\pi$ equivalent circuit of the circuit shown in FIG. 3.
Figure 5:
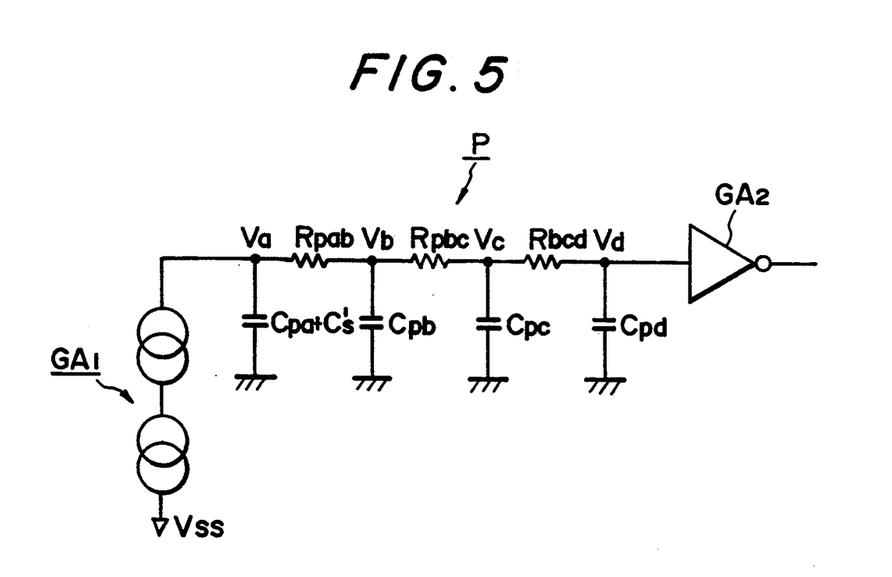

In this embodiment, when a circuit layout pattern inspection is carried out, first, the parasitic resistance Rp and the parasitic capacitance Cp are extracted by the Rp and Cp extraction part 10 in ST1. When performing the circuit layout pattern inspection of a circuit including a drive gate GA1 and an output gate GA2 connected in series via a wiring P as shown in FIG. 3, the Rp and Cp extraction part 10 extracts the parasitic resistance Rp and the parasitic capacitance Cp of the wiring P. The number of the parasitic resistance elements Rp and the parasitic capacitance elements Cp (that is, the number of nodes) and the values of the parasitic resistance Cp and the parasitic capacitance Cp are different depending on the length of the wiring P, its material (aluminum or polycrystalline silicon), the presence or absence of a branch or branches, the number of branches and the like. For instance, as shown in FIG. 4 or FIG. 5, four nodes are set up and parasitic resistances Rpab, Rpbc and Rpcd as the Rp between the nodes and parasitic capacitances Cpa, Cpb, Cpc and Cpd as the Cp at the nodes are extracted.

The π equivalent circuit generation part 16 generates a π equivalent circuit of the wiring P from the extracted elements such as the parasitic resistances Rpab, Rpbc and Rpcd and the parasitic capacitances Cpa, Cpb, Cpc and Cpd in ST2. The π equivalent circuit is an equivalent circuit including the parasitic resistances arranged in series between the adjacent two nodes along the wiring and the parasitic capacities connected between each of the nodes and ground.

Figure 6:
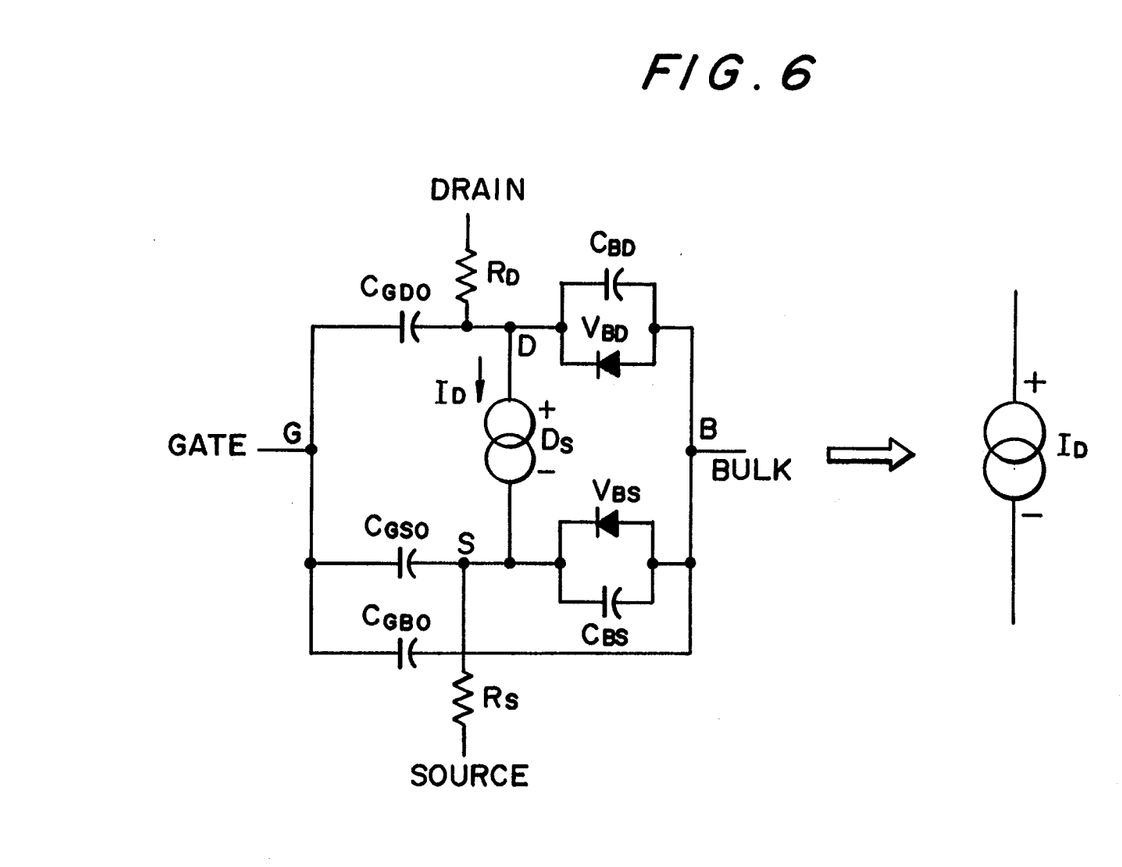
FIG. 6 is a circuit diagram of an equivalent circuit of an NMOSFET in a drive gate shown in FIGS. 3 to 5 and its approximate circuit.

The current source calculation formula generation part 20 reads in the parameters from the data base 18 in ST 3, and expresses the drive gate GA1 of the wiring P as the current source calculation formula of the simplified model in ST4. For example, when the drive gate CA1 includes an NMOSFET, this NMOSFET can be approximated to a current source shown in the right half of FIG. 6. The actual equivalent circuit of the NMOSFET is, for instance, shown by a complicated circuit shown in the left half of FIG. 6. However, in this embodiment, this complicated equivalent circuit is simplified to the current source shown in the right half of FIG. 6 so as to readily be able to meet the change of the parameters stored in the data base 18. In this instance, the simplified model also includes an electrostatic capacitance (omitted in the circuit shown in the right half of FIG. 6), and the electrostatic capacitance can be included in the parasitic capacitance Cp (refer to as Cs and Cs' in FIG. 4 and FIG. 5). Further, the current value of the current source of the simplified model is the value stored in the data base 18, that is, the current value of the complicated circuit shown in the left half of FIG. 6 can be used as it is.

In this embodiment, thus the two kinds of current source calculation formulas are obtained. That is, by describing the operation at either a rising edge or a falling edge of an input signal to the wiring P from the drive gate GA1, two kinds of current source calculation formulas can be set up. Since the drive gate GA1 shown in FIG. 3 is an NAND gate of a CMOSFET, the drive gate GA1 is considered as a PMOSFET at the rising edge and an NMOSFET at the falling edge. As a result, the current source calculation formula at the leading edge is a formula exhibiting the operation of the current source connected to a power source $V_{DD}$ and the electrostatic capacitance Cs, as shown in FIG. 4, and the current source calculation formula at the falling edge is a formula exhibiting the operation of the current source connected to a power source $V_{ss}$ and the electrostatic capacitance Cs', as shown in FIG. 5. In FIG. 5, two current sources are provided in consideration of a wiring logic W/L of the NAND gate GA1.

Then, the simulation of the nodal equation is performed by the simulation part 14 in ST5 to ST7. The nodal equation used for the simulation is composed of simultaneous equations of a formula representing the π equivalent circuit of the wiring P and the current source calculation formula. In the example shown in FIG. 3, as shown in FIGS. 4 and 5, the nodal voltages Va, Vb, Vc and Vd at the nodes are unknown in the equations. In this embodiment, as described above, since the current source calculation formula to be used is different depending on whether operation at the rising edge or the falling edge is simulated, one of the two current source calculation formulas is selected as required.

First, the simulation part 14 performs the numerical calculation of the nodal equation to obtain the nodal voltages Va, Vb, Vc and Vd in ST5. On the basis of the result of the numerical calculation, the simulation part 14 discriminates whether or not the input nodal voltage of each gate crosses a threshold voltage Vth such as $V_{DD}/2$ of the output gate CA2 in ST6. For instance, when the operation at the rising edge is simulated, assuming that the nodal voltage passes over the threshold value Vth at one node at a certain time, the time which elapses from the input time of the wiring P to this time is the time required for the signal change (rising edge) to be transmitted up to the node, that is, the delay time. In turn, when the operation at the falling edge is simulated, assuming that the nodal voltage passes below the threshold value Vth at one node at a certain time, the time which elapses from the input time of the wiring P to this time is the delay time required for which the signal change (falling edge) to be transmitted up to the node.

Accordingly, by the discrimination regarding the above-described threshold value Vth, the delay time can be obtained. When the discrimination result is "YES", the simulation part 14 registers the obtained delay time in a memory or the like within the simulation part 14 in ST8. When the discrimination result is "NO", the simulation part 14 increases the time stepwise in ST7 in order to return to ST 5 and to continue the operation again from STS.

Hence, the aforementioned operation is performed in respect of all gates and all wiring on the layout pattern to evaluate the delay time for the output wiring of each gate.

Figure 7:
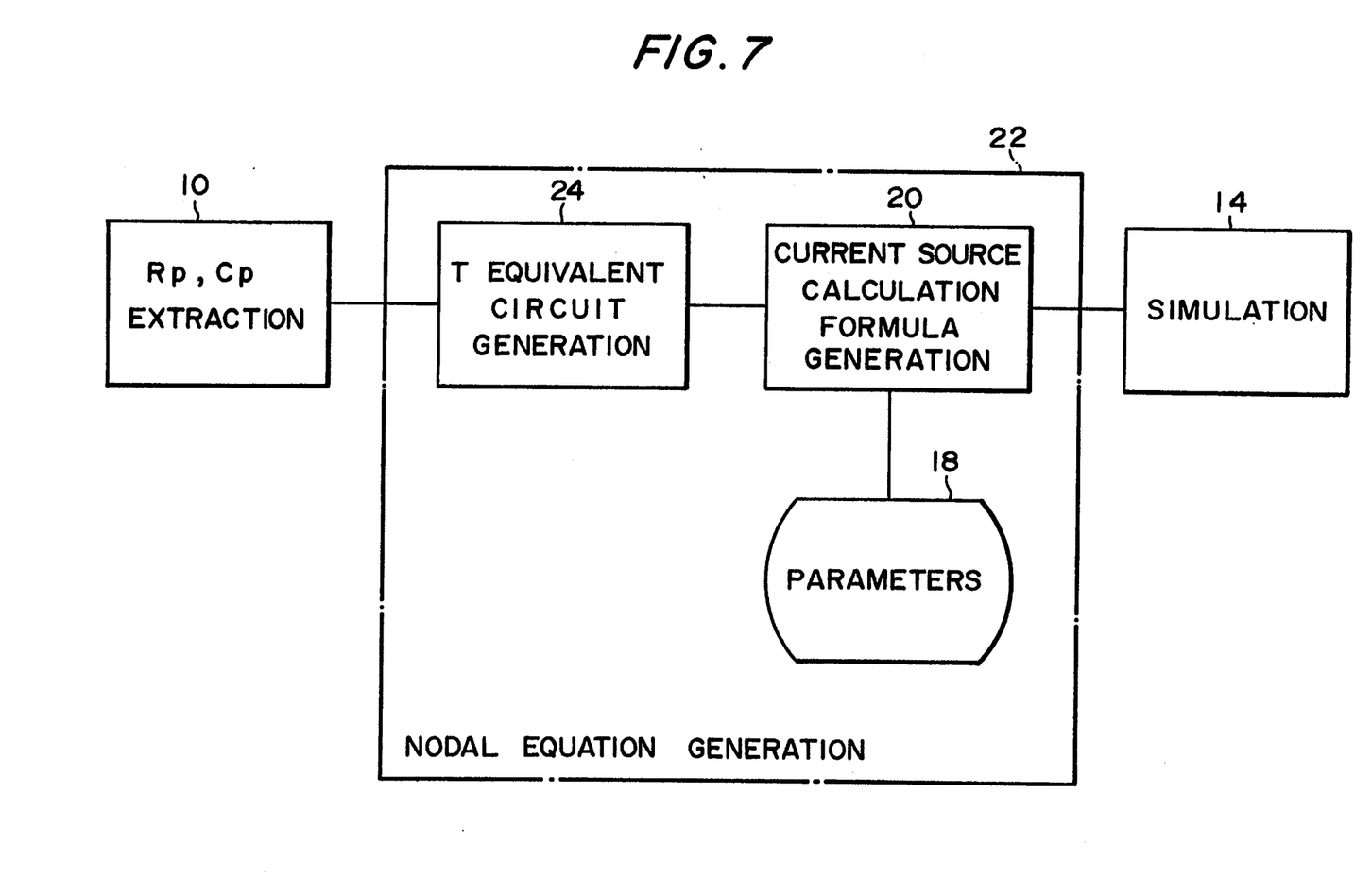
FIG. 7 is a block diagram of a logical simulator for implementing a second embodiment of a circuit layout pattern inspection method according to the present invention.

In FIG. 7, there is shown a logical simulator for implementing the second embodiment of a circuit layout pattern inspection method according to the present invention, having the same construction except that a nodal equation generation part 22 includes a T equivalent circuit generation part 24 in place of the $\pi$ equivalent circuit generation part 16 of the first embodiment, a data base 18 and a current source calculation formula generation part 20. In this embodiment, the T equivalent circuit generation part 24 generates a T equivalent circuit of the wiring P, and the circuit layout pattern inspection is carried out in the similar manner to the first embodiment described above.

Although the present invention has been described in its preferred embodiments with reference to the accompanying drawings, it is readily understood that the present invention is not restricted to the preferred embodiments and that various changes and modifications can be made by those skilled in the art without departing from the spirit and scope of the present invention.

What is claimed is:

1. A logical simulator, comprising:
   extracting means for extracting parasitic elements including a parasitic resistance on wiring from a circuit layout pattern to be simulated;
   wiring means, coupled to said extracting means, for generating an equivalent circuit of the wiring from the extracted parasitic elements;
   gate means, coupled to said wiring means for generating an equivalent circuit of a gate for outputting a signal to the wiring on the basis of a parameter describing characteristics of an active element constituting the gate according to a simplified model;
   simulation means, coupled to said gate means for performing a simulation of an operation at nodes on the wiring corresponding to an operation of the gate on the basis of the equivalent circuit of the wiring and the equivalent circuit of the gate; and
   delay means, coupled to said simulation means, for obtaining a delay time required for the signal to be transmitted to the wiring from the result of the simulation.

2. The simulator of claim 1, wherein the parasitic elements include a parasitic capacitance.

3. The simulator of claim 1, wherein the wiring means generates the equivalent circuit of the wiring expressed as a concentrated constant circuit.

4. The simulator of claim 3, wherein the wiring means generates a nodal equation describing the equivalent circuit of the wiring.

5. The simulator of claim 3, wherein the wiring means generates the equivalent circuit of the wiring as a $\pi$ equivalent circuit.

6. The simulator of claim 3, wherein the wiring equivalent circuit generating means generates the equivalent circuit of the wiring as a T equivalent circuit.

7. The simulator of claim 1, wherein the gate means includes storing means for storing the parameters describing the characteristics of the active element.

8. The simulator of claim 1, wherein the simplified model includes a current source and an electrostatic capacitance.

9. A circuit layout pattern inspection method, comprising the steps of:
   extracting parasitic elements including a parasitic resistance on wiring from a circuit layout pattern to be simulated;
   generating an equivalent circuit of the wiring from the extracted parasitic elements;
   generating an equivalent circuit of a gate for outputting a signal to the wiring on the basis of a parameter describing characteristics of an active element constituting the gate according to a simplified model;
   performing a simulation of an operation at nodes on basis of the equivalent circuit of the wiring and the equivalent circuit of the gate; and
   obtaining a delay time required for the signal to be transmitted to the wiring from the result of the simulation.

10. The method of claim 9, wherein the parasitic elements include a parasitic capacitance.

11. The method of claim 9, wherein the equivalent circuit of the wiring is expressed as a concentrated constant circuit.

12. The method of claim 11, wherein the equivalent circuit of the wiring is described as a nodal equation.

13. The method of claim 11, wherein the equivalent circuit of the wiring is described as a $\pi$ equivalent circuit.

14. The method of claim 11, wherein the equivalent circuit of the wiring is described as a T equivalent circuit.

15. The method of claim 11, wherein the simplified model includes a current source and an electrostatic capacitance.

* * * * *